United States Patent [19]
Mochida et al.

[11] Patent Number: 6,033,932
[45] Date of Patent: Mar. 7, 2000

[54] LEAD FRAME SUPPLYING APPARATUS

[75] Inventors: Tooru Mochida, Higashiyamato; Shinichi Baba, Fuchu, both of Japan

[73] Assignee: Kabushiki Kaisha Shinkawa, Tokyo, Japan

[21] Appl. No.: 09/305,078

[22] Filed: May 4, 1999

Related U.S. Application Data

[62] Division of application No. 08/959,384, Nov. 18, 1997, Pat. No. 6,001,670.

[30] Foreign Application Priority Data

Nov. 18, 1996 [JP] Japan .................................. H8-322209

[51] Int. Cl.⁷ .................................................. H01L 21/44
[52] U.S. Cl. ..................... 438/111; 414/417; 414/790.6
[58] Field of Search ...................................... 438/111, 123; 414/331, 416, 417, 740.4, 790.6, 939

[56] References Cited

U.S. PATENT DOCUMENTS

| | | | |
|---|---|---|---|
| 5,827,035 | 10/1998 | Fuitie et al. | 414/417 |
| 5,868,542 | 2/1999 | Fuke et al. | 414/416 |
| 5,897,290 | 4/1999 | Lu et al. | 414/790.4 |
| 5,915,957 | 6/1999 | Tanigawa | 414/416 |

*Primary Examiner*—Kevin M. Picardat
*Attorney, Agent, or Firm*—Koda & Androlia

[57] ABSTRACT

In a bonding apparatus such as a wire bonding apparatus, die bonding apparatus and the like in which lead frames are supplied from a lead frame magazine to a bonding section via a frame conveying path, when the absence of a lead frame in the frame storing section of a lead frame magazine is detected by a sensor in spite of the fact that a frame pusher for pushing out the lead frame from the magazine has operated, a judgement is made that no more lead frames are contained in the frame magazine, so that a lowermost frame storing section of the next magazine is moved to the level of the frame conveying path.

2 Claims, 4 Drawing Sheets

LEAD FRAME SUPPLYING APPARATUS

This is a Divisional application of application Ser. No. 08/959,384, filed Nov. 18, 1997 now U.S. Pat. No. 6,001,670.

BACKGROUND OF THE INVENTION

1. Field of the Invention

The present invention relates to a method and apparatus for supplying lead frames stored inside a magazine to a frame feeder in a bonding apparatus such as a wire bonding apparatus, die bonding apparatus and the like.

2. Prior Art

A conventional bonding apparatus is described with reference to FIGS. 4(a) and 4(b).

Loader side magazines 1 (1A, 1B . . . ) and unloader side magazines 2 (2A, 2B . . . ) are respectively positioned at both ends of the guide rails 11 of a frame feeder 10. These loader side magazines 1 and unloader side magazines 2 are positioned and carried on magazine holders 5 which are respectively driven up and down by a loader side elevator 3 and an unloader side elevator 4. Lead frames 6 are stored in the loader side magazines 1 and pushed out onto the frame conveying path 11a of the guide rails 11 by a frame pusher 7.

Examples of bonding systems equipped with elevator devices of the type described above are disclosed in Japanese Patent Application Publication (Kokoku) Nos. S63-56122, H1-32127 and H2-4486.

The system described in, for example, Japanese Patent Application Publication No. S55-7944 shows no frame pusher 7 and instead includes a pull-in claw 8.

The conventional bonding apparatuses thus include either a frame pusher 7 or a pull-in claw 8; and the pull-in claw 8 is shown by a two-dot chain line in FIG. 4(a). In the apparatus that includes such a pull-in claw 8, the lead frames 6 inside the loader side magazines 1 are pulled by the pull-in claw 8 so as to be moved onto the frame conveying path 11a of the guide rails 11.

The frame feeder 10 which conveys the lead frames 6 includes a pair of guide rails 11, which have a frame conveying path 11a that guides the lead frames 6, as well as loader side feeding claws 12 and unloader side feeding claws 13. The loader side feeding claws 12 and unloader side feeding claws 13 consist of respective pairs of upper claws 12a and 13a and lower claws 12b and 13b as best shown in FIG. 4(b). The loader side feeding claws 12 and unloader side feeding claws 13 are opened and closed by claw open/close means (not shown) and are caused to move along the guide rails 11 by a claw moving means (not shown). Furthermore, a frame confirmation sensor 14 which detects the presence of a lead frame 6 is installed between the guide rails 11 so as to be on the side of the loader side magazines 1.

This type of the frame feeders 10 are described in Japanese Patent Application Publication (Kokoku) No. S63-56122 and Japanese Patent Application Laid-Open (Kokai) No. H4-346446.

A bonding apparatus 20, such as a wire bonding apparatus, die bonding apparatus, etc. is installed on one side of the guide rails 11 so as to face the bonding position 15. This bonding apparatus 20 has an XY table 21 which is driven in the X and Y directions, and a bonding head 22 is mounted on this XY table 21. In addition, a camera holder 24 to which a television camera 23 is attached is fastened to the bonding head 22. Furthermore, a bonding arm 26 to which a bonding tool 25 is attached is installed on the bonding head 22 so that the bonding arm 26 can be moved up and down along the two-dotted line in FIG. 4(b). The television camera 23 is positioned so as to be above the bonding position 15, as best seen from FIG. 4(b), and the bonding tool 25 is offset by a distance of Y1 from the television camera 23 as shown in FIG. 4(a). The bonding arm 26 is raised and lowered by a Z (vertical) driving motor (not shown).

One example of a bonding apparatus 20 of this type is described in Japanese Patent Application Laid-Open (Kokai) No. H5-275502.

With the apparatus described above, lead frames 6 inside the loader side magazines 1 are pushed out by the frame pusher 7 to a position where the lead frames 6 can be chucked by the loader side feeding claws 12. Afterward, the frame pusher 7 returns to its original position.

There are two types of pull-in claws 8 which pull out the lead frames 6: one type inserts a pull-out pin into each lead frame 6, and another type chucks each lead frame 6 from above and below.

In the case of the type which inserts a pull-out pin, the pull-in claw 8 is moved into the loader side magazine 1 and then lowered so that the pull-out pin is inserted into a hole (not shown) of a lead frame 6. Next, the pull-in claw 8 is moved in the feeding direction (toward the bonding position 15, rightward in FIGS. 4(a) and 4(b)) so as to pull out the lead frame 6 from the magazine 1 to the position 15 where the lead frame 6 can be chucked by the loader side feeding claws 12. Afterward, the pull-in claw 8 is raised and returns to its original position.

In the case of the type which chucks each lead frame from above and below to take out the lead frames, the pull-in claw 8 holding a lead frame 6 from above and below pulls the lead frame 6 out of the loader side magazine 1, and then the loader side feeding claws 12 hold the lead frame 6 and transfer the lead frame 6 to the bonding position 15.

When the frame confirmation sensor 14 detects the presence of the lead frame 6 thus taken out by either the frame pusher 7 or the claw 8 onto the guide rails 11, the loader side feeding claws 12 close and chuck the lead frame 6 and then intermittently feed the lead frame 6 along the frame conveying path 11a of the guide rails 11. In other words, an intermittent feeding action is repeated so that the loader side feeding claws 12 open, return to their original position, close and chuck the lead frame 6, and again feed the lead frame 6 by a fixed amount. The bonding portions of the lead frame 6 are thus successively fed to the bonding position 15.

Each time a bonding portion of the lead frame 6 is fed to the bonding position 15, bonding is performed by the bonding apparatus 20. After the bonding is completed, the lead frame 6 is intermittently fed by the unloader side feeding claws 13 and is stored in the unloader side magazine 2.

In the above operation, the lead frames 6 are stored in a stacked configuration with a fixed spacing in the loader side magazines 1 and unloader side magazines 2. Accordingly, each time that a lead frame 6 is supplied to the frame conveying path 11a of the guide rails 11 from one of the loader side magazines 1, and each time a lead frame 6 is transferred into one of the unloader side magazines 2 from the conveying path 11a, the loader side magazine 1 and unloader side magazine 2 are lowered by one pitch, so that the frame storing section of the loader side magazine 1 or unloader side magazine 2 which stores or is to store the next lead frame 6 is positioned at the conveying path level of the frame conveying path 11a. The "conveying path level" of the frame conveying path 11a refers to a height suitable for feeding a lead frame 6 onto the frame conveying path 11a.

In a system where two or more loader side magazines 1 (1A, 1B . . . ) and unloader side magazines 2 (2A, 2B . . . ) are stacked on the magazine holders 5 of the loader side elevator 3 and unloader side elevator 4, after the lead frame 6 in the uppermost frame storing section of one loader side magazine 1 has been fed out at the conveying path level of the frame conveying path 11a, or after a lead frame 6 has been stored in the uppermost frame storing section of one unloader side magazine 2, the loader side magazine 1 or unloader side magazine 2 is lowered so that the lowermost frame storing section of the loader side magazine 1 or unloader side magazine 2 positioned immediately above the loader side magazine 1 or unloader side magazine 2 is positioned at the conveying path level of the frame conveying path 11a.

In ordinary production plan, the lead frames 6 are controlled in lots; however, one lot hardly ever consists of a number of lead frames 6 equal to the number of frame storing sections times one loader side magazine (the number of frame storing sections×N (where N is the number of loader side magazines 1)). Accordingly, the last loader side magazine 1 of one lot is not always completely filled with lead frames 6. FIG. 4(b) illustrates a case wherein the loader side magazine 1B is the last magazine of one lot; and four frame storing sections of the magazine 1B are empty. In FIG. 4(b), in order to facilitate understanding, frame storing sections which do not contain lead frames are shown by two-dot chain lines.

In this situation, the loader side magazines 1 (1A, 1B . . . ) are lowered one stage at a time by the loader side elevator 3; and each time the magazines are lowered, a push-out operation is performed by the frame pusher 7 or a pull-in operation is performed by the pull-in claw 8, regardless of whether or not a lead frame 6 is on the stage (or in the storing section) of the loader side magazine 1 (1A, 1B, etc.). Then, when a pre-set number of stages (stored in a memory) is reached, the loader side magazine 1 (1A, 1B, etc.) is removed; and the first stage of the next magazine is positioned at the conveying path level of the frame conveying path 11a, thus continuing the lead frame supply operations.

As seen from the above, in the case of the loader side magazine which is the last magazine of a lot, the frame pusher or pull-in claw goes through the feeding out operation even though the lead frame storing sections do not contain a lead frame. During this period, no lead frames are supplied to the frame conveying path 11a. In other words, the bonding apparatus 20 cannot perform bonding and is therefore placed in waiting, making productivity poor.

SUMMARY OF THE INVENTION

Accordingly, the object of the present invention is to provide a lead frame supplying method and apparatus that can locate loader side magazines which are not completely filled with lead frames and remove such loader side magazines quickly after they have become empty, so that the lead frames in the next loader side magazine can be supplied to the frame feeder without wasting time, thus eliminating the waiting time between lots and improving productivity.

This object is accomplished by a unique lead frame supplying method of the present invention in which a loader side magazine is positioned and carried on a loader side elevator which is driven up and down, and lead frames inside the loader side magazine are supplied to a frame feeder by a frame pusher or pull-in claw, and the lead frame supplying method is characterized in that when a frame confirmation sensor installed on the loader side magazine side of a frame feeder detects the absence of a lead frame in spite of the fact that the frame pusher or pull-in claw has operated, a judgement is made so that no lead frame is in the lead frame storing section of the loader side magazine, and the lowermost lead frame storing section of the next loader side magazine is positioned at the frame conveying path level of the frame feeder.

The above object is accomplished by a unique structure for a lead frame supplying apparatus of the present invention in which a loader side magazine is positioned and carried on a loader side elevator which is driven up and down, and lead frames inside the loader side magazine are supplied to a frame feeder by a frame pusher or pull-in claw, and the lead frame supplying apparatus is characterized in that the apparatus includes a control circuit which comprises a judgement circuit and a calculating unit, the judgement circuit judging that a lead frame confirmation sensor installed on the loader side magazine side of the frame feeder detects the absence of a lead frame in spite of the fact that the frame pusher or pull-in claw has operated, and the calculating unit obtaining the amount of movement required to position the lowermost frame storing section of the next loader side magazine at the frame conveying path level of the frame feeder in accordance with a signal from the judgement circuit.

BRIEF DESCRIPTION OF THE DRAWINGS

FIG. 4 shows the schematic layout of lead frame supplying and storing devices used in a bonding apparatus, in which

DETAILED DESCRIPTION OF THE INVENTION

Figure 4A:
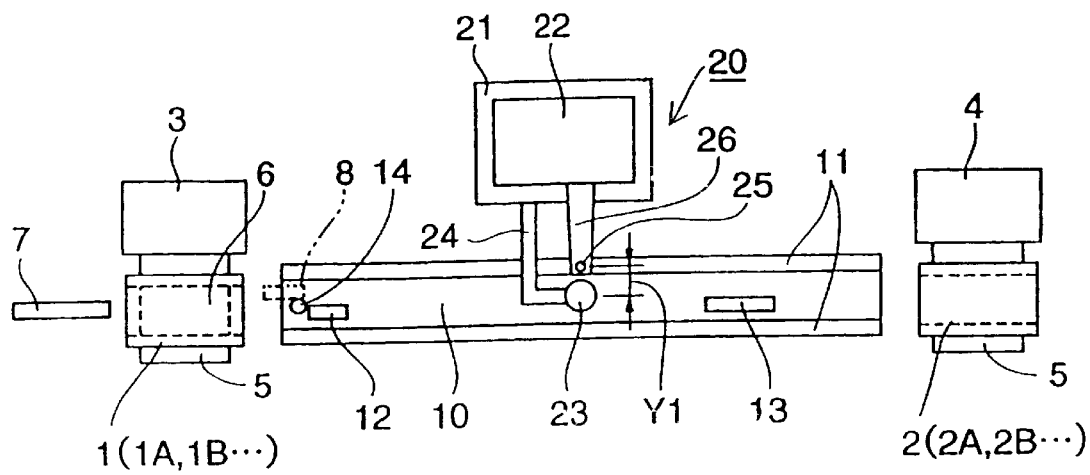
FIG. 4(a) is a top view thereof.
Figure 4B:
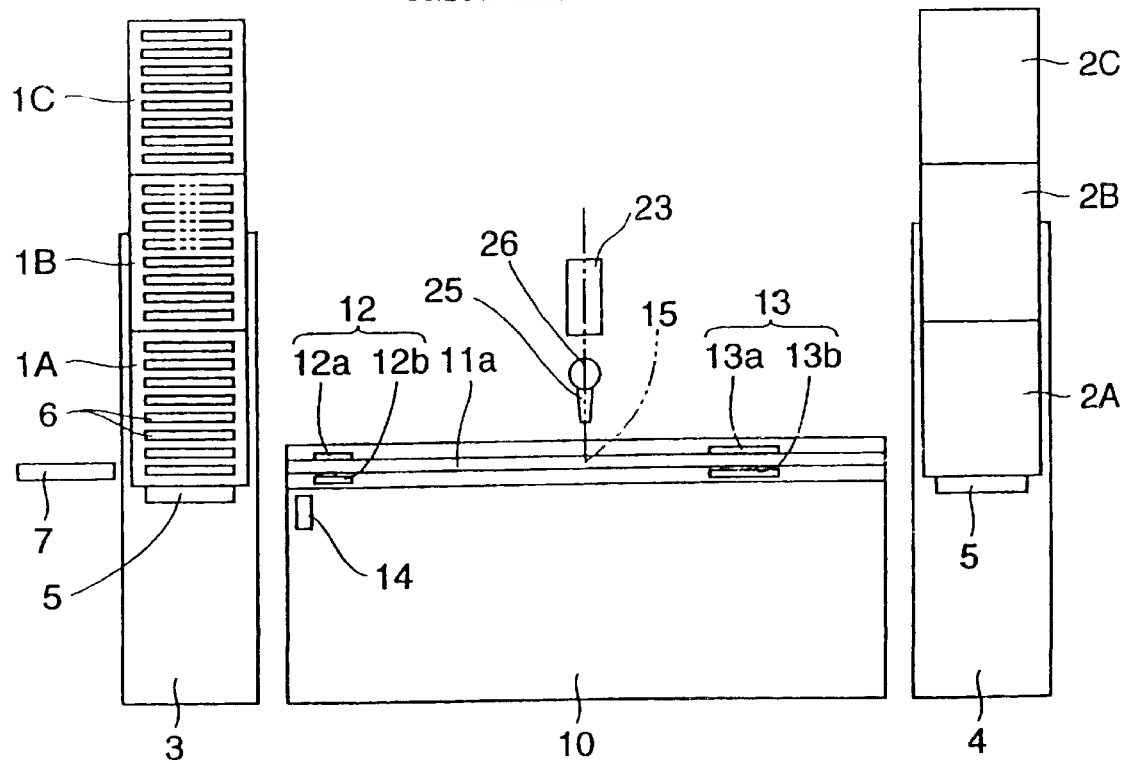
FIG. 4(b) is a sectional front view thereof.

In the lead frame supplying method and apparatus wherein the present invention is embodied, as shown in FIG. 4, loader side magazines 1 (1A, 1B . . . ) are positioned and carried on a loader side elevator 3 which is driven up and down, either a frame pusher 7 or a pull-in claw 8 (which are collectively called a lead frame feed out means) is employed, and lead frames 6 stored in the loader side magazines 1 are supplied to a frame feeder 10 by the frame pusher 7 or pull-in claw 8, as shown in FIG. 4, thus improving this apparatus.

In the lead frame supplying method of the present invention, as seen from FIGS. 2 and 4, the lead frame storing sections indicated by two-dot chain lines in the loader side magazine 1B do not contain any lead frame 6. When a frame confirmation sensor 14 installed on the loader magazine side of the frame feeder 10 detects the absence of a lead frame 6 in spite of the fact that a lead frame feed out means (that is, the frame pusher 7 or pull-in claw 8) has operated as shown in FIG. 2(c) from the state shown in FIG. 2(b), then a judgement is made that no (further) lead frames 6 are stored in the loader side magazine 1B; as a result, the magazine holder 5 is lowered by a distance A as shown in FIG. 2(d), thus positioning the lowermost storing section of the next loader side magazine 1C, that contains a lead frame therein, at the conveying path level of the frame conveying path 11a of the frame feeder 10.

Figure 2A:
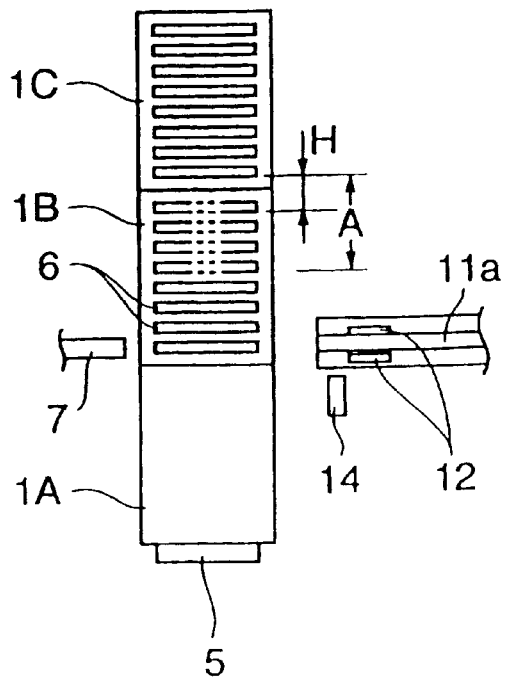
FIGS. 2(a)–(d) is an explanatory diagram illustrating a process shown in FIG. 1.
Figure 2B:
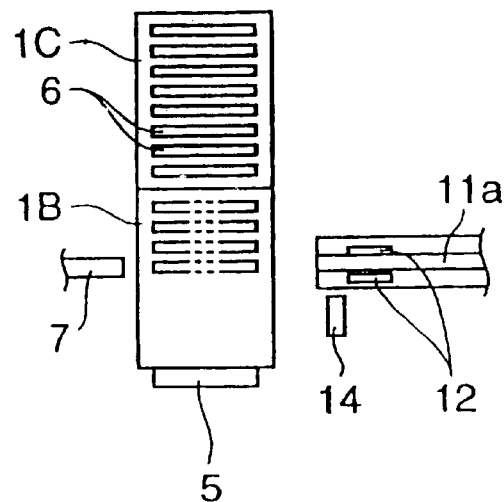
Figure 2C:
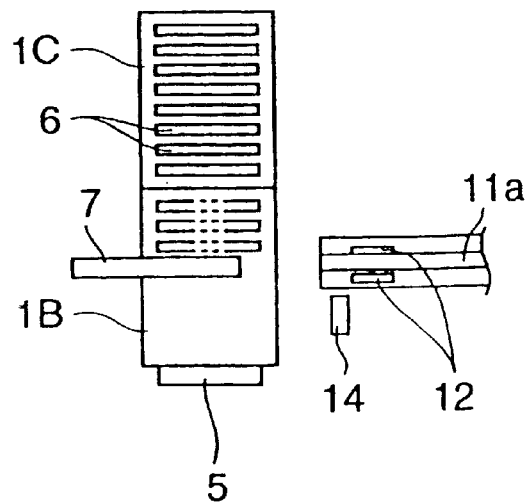
Figure 2D:
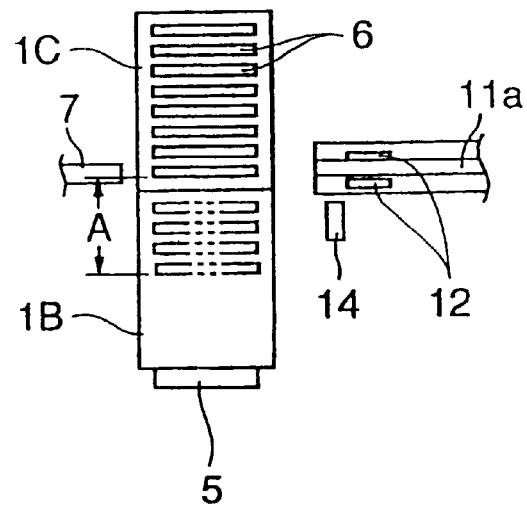
Figure 3:
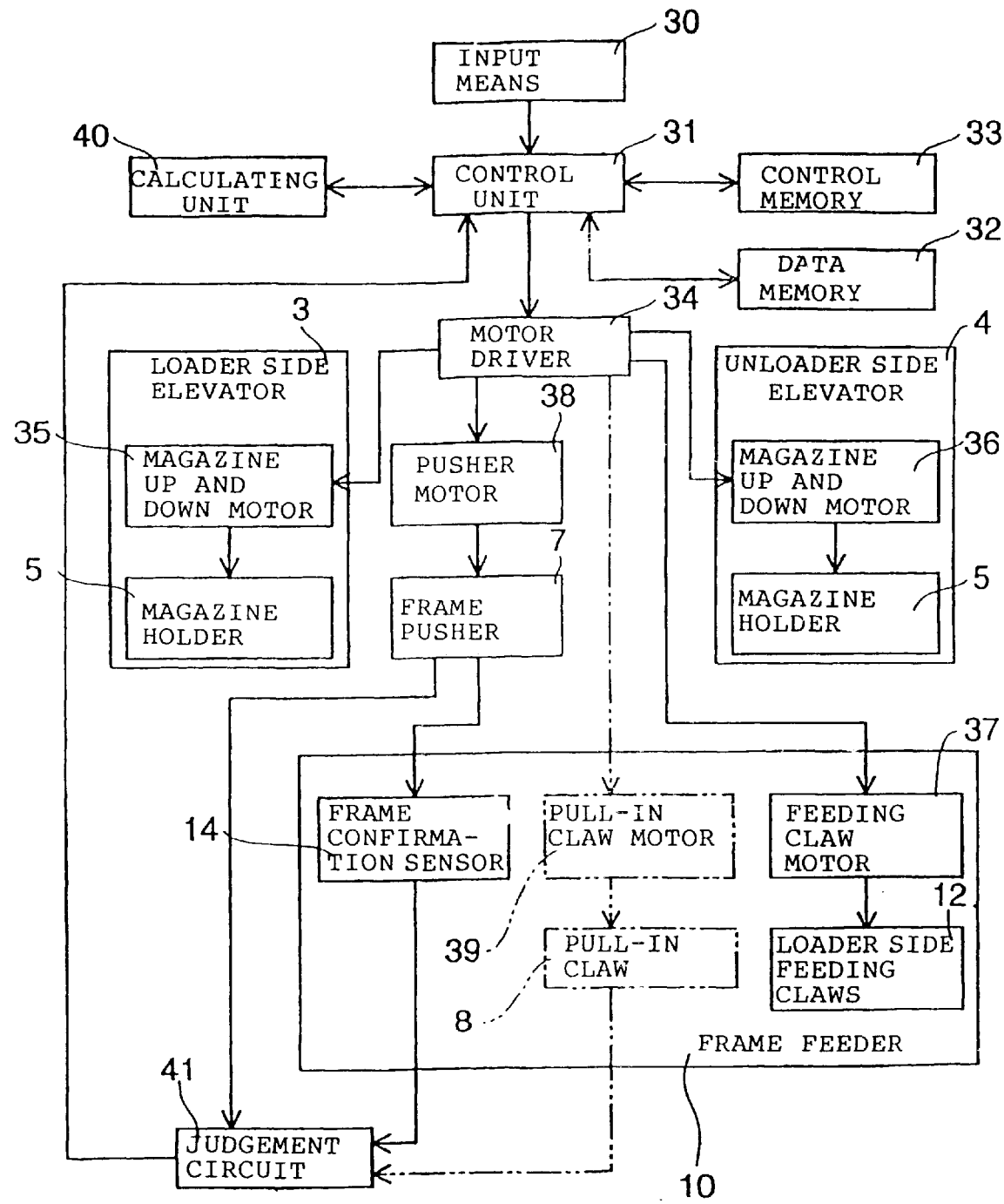
FIG. 3 is a block diagram which illustrates the control circuit of a lead frame supplying apparatus according to embodiment of the present invention.

On the other hand, the lead frame supplying apparatus of the present invention, as seen from FIGS. 2, 3 and 4, is provided with a control circuit. The control circuit includes a judgement circuit 41, which judges when the absence of a lead frame 6 from the loader side magazine 1B is detected in spite of the fact that the lead frame feed out means (that is, the frame pusher 7 or pull-in claw 8) has operated, and a calculating unit 40, which calculates, in accordance with a signal from the judgement circuit 41, the amount of movement A required to position the lowermost frame storing section of the next loader side magazine 1C at the conveying path level of the frame conveying path 11a of the frame feeder 10 as shown in FIG. 2(d).

The present invention is described below in further detail.

FIG. 3 shows the control circuit used in the present invention, and this control circuit will be described with reference to FIG. 4.

Various types of data required to operate the apparatus are inputted via an input means 30 and stored in a data memory 32 via a control unit 31. In other words, data such as the number N of frame storing sections of the magazines 1 and 2, the pitch P of the frame storing sections, and the dimension H from the uppermost frame storing section of the loader side magazine 1A to the lowermost frame storing section of the loader side magazine 1B located above the loader side magazine 1A, etc. are stored in the data memory 32 through the control unit 31. Programs which operate the apparatus via the control unit 31 are stored in a control memory 33.

The control unit 31 reads out data stored in the data memory 32 in accordance with the programs of the control memory 33 and drives magazine up and down motors 35 and 36 of the loader side elevator 3 and unloader side elevator 4, a feeding claw motor 37, and a pusher motor 38 or pull-in claw motor 39, via a motor driver 34. The circuit described above is known in the prior art.

In the present invention, the control circuit described above includes a judgement circuit 41 which judges that no (further) lead frames 6 are stored in a loader side magazine 1. This judgment is made when the frame pusher 7 or pull-in claw 8 is operated and the absence of a lead frame 6 is detected by the frame confirmation sensor 14.

Figure 1A:
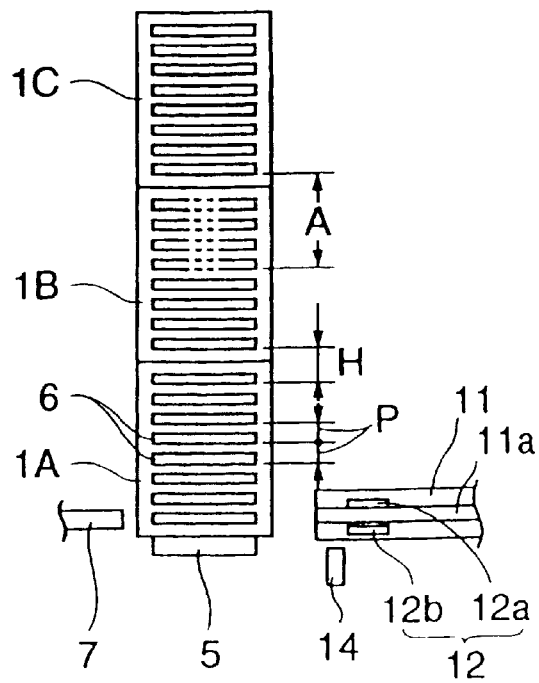
FIGS. 1(a)–(c) is an explanatory diagram illustrating the process of a lead frame supplying method according to one embodiment of the present invention.

A signal from this judgement circuit 41 is inputted into the control unit 31, and the amount of movement A to the lowermost frame storing section of the next loader side magazine 1C shown in FIG. 1 is calculated by the calculating unit 40.

When the judgement circuit 41 detects the absence of a lead frame 6 in the nth frame storing section of the loader side magazine 1B, the amount of movement A is calculated by Equation 1 shown below. In this Equation 1, N is the number of the frame storing sections, P is the pitch of the frame storing sections, and H is the dimension (or distance) from the uppermost frame storing section of the magazine 1A to the lowermost frame storing section of the magazine 1B located above the magazine 1A.

Equation 1

$$A = (N-n) \cdot P + H$$

Next, the operation of the loader side elevator 3 will be described with reference to FIGS. 1 and 2 and also to FIG. 4.

Steps in FIGS. 1(a) through 1(c) and FIG. 2(a) are the same as in a conventional device, and the description will be made for a case in which a frame pusher 7 (and not a push-in claw 8) is used. In addition, the description begins with the state shown in FIG. 1(a), in which the lowermost frame storing section of the loader side magazine 1A is positioned at the conveying path level of the frame conveying path 11a.

Figure 1B:
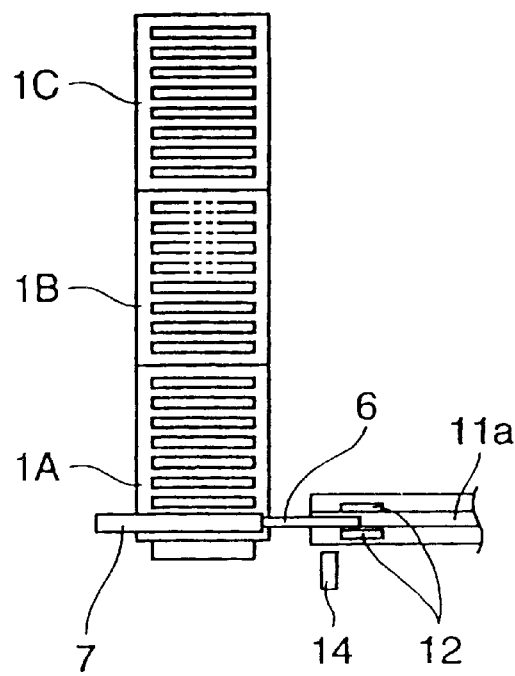

When the apparatus starts its operation, the frame pusher 7 functions so that a lead frame 6 is pushed out to a position where the lead frame 6 can be chucked by the loader side feeding claws 12, as shown in FIG. 1(b). Then, the loader side feeding claws 12 close and chuck the lead frame 6, and the lead frame 6 is fed along the frame conveying path 11a of the guide rails 11, so that bonding portions of the lead frame 6 are successively fed to the bonding position 15.

Figure 1C:
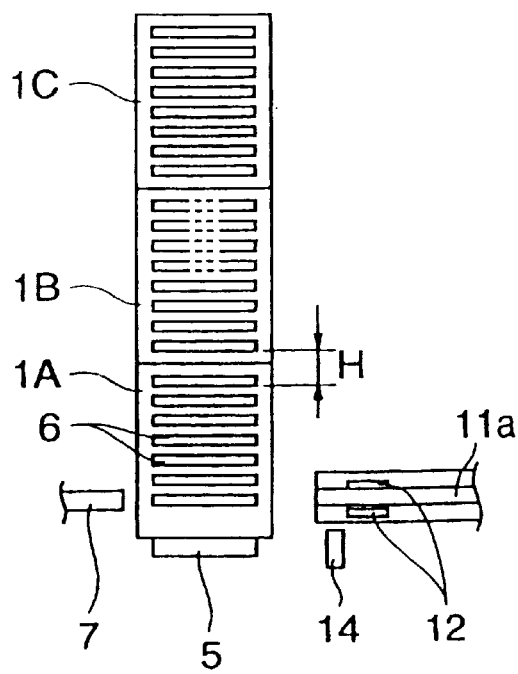

When the frame confirmation sensor 14 confirms that the lead frame 6 has been completely fed out into the space between the guide rails 11, the magazine holder 5 is lowered by one pitch P (which is stored in the data memory 32), so that the next lead frame 6 is positioned at the conveying path level of the frame conveying path 11a as shown in FIG. 1(c). Afterward, the magazine holder 5 is lowered by one pitch P each time that a lead frame 6 is fed out into the space between the guide rails 11.

Such an operation is successively and intermittently repeated until the uppermost lead frame 6 in the loader side magazine 1A is positioned at the conveying path level of the frame conveying path 11a, and the uppermost lead frame 6 is fed out. In other words, the feed-out operation of lead frames 6 onto the guide rails 11 is performed a number of times that is equal to the number N (stored in the data memory 32) of frame storing sections of each loader side magazine 1.

Following this operation, the magazine holder 5 is lowered by an amount that corresponds to the data H (which is the distance from the uppermost frame storing section of the magazine 1A to the lowermost frame storing section of the magazine 1B placed on the magazine 1A) stored in the data memory 32. As a result, the lowermost lead frame 6 in the loader side magazine 1B is positioned at the conveying path level of the frame conveying path 11a as shown in FIG. 2(a), so that this lead frame 6 can be fed out on the guide rails 11.

Then, the lowermost lead frame 6 in the loader side magazine 1B is fed out onto the guide rails 11 and is fed to the working position (bonding position) by the frame feeder 10. Bonding is then performed on this lead frame 6, and the loader side magazine 1A is discharged from the magazine holder 5 by an operation similar to that in the conventional apparatus described in Japanese Patent Application Publication (Kokoku) No. H1-32127 before the signal allowing feeding out of the next lead frame 6 into the guide rails 11 arrives.

After the discharge of the loader side magazine 1A, the loader side magazines 1B with the magazine 1C thereon is positioned on the magazine holder 5. Subsequently, the lead frames 6 in the loader side magazine 1B are fed out onto the guide rails 11 by the operation illustrated in FIGS. 1(a) through 1(c).

In the loader side magazine 1B, there are no lead frames 6 in some of the frame storing sections beginning at an intermediate point as indicated by the two-dot chain lines (in other words, the top four frame storing sections are empty). Accordingly, when a frame storing section that contains no lead frame 6 is positioned at the conveying path level of the frame conveying path 11a by the operation as shown in FIG. 2(b), and the frame pusher 7 advances as shown in FIG. 2(c), the frame confirmation sensor 14 detects the absence of a lead frame 6. As a result, the judgement circuit 41 shown in FIG. 3 judges that a lead frame 6 is absent based on the condition that the frame pusher 7 has operated and the frame confirmation sensor 14 has detected the absence of a lead frame 6. As a result, a signal indicating this is inputted into the control unit 31.

In accordance with the signal from the judgement circuit 41, the control unit 31 reads out the data N, P and H stored in the data memory 32; and the stage number n of the loader side magazine 1B in which a lead frame 6 was not detected by the frame confirmation sensor 14 is inputted in the calculating unit 40; consequently, the calculating unit 40 calculates the amount of movement A to the lowermost frame storing section of the loader side magazine 1C by way of the Equation 1.

Then, as shown in FIG. 2(d), the loader side magazines 1B, 1C . . . are lowered by an amount corresponding to the amount of movement A, so that the lowermost frame storing section of the loader side magazine 1C is positioned at the conveying path level of the frame conveying path 11a. After this, the loader side magazine 1B is discharged by the same operation as in the conventional device described Japanese Patent Application Publication (Kokoku) No. H1-32127.

On the loader side magazine 1C whose frame storing sections are all filled with lead frames, an ordinary, known feed-out operation of the lead frames is performed.

As seen from the above, a judgement as to whether or not any further lead frames 6 are stored in the loader side magazine 1B is made based upon a single operation of the frame pusher 7 that moves in the empty frame storing section. However, this operation may cause some problems: in some cases, the operator takes out a lead frame 6 from a loader side magazine for the purposes of a quality check. If this occurs, a given loader side magazine 1 is removed because the operation of the frame pusher 7 indicates that no more lead frames are stored in the magazine 1 which in fact still contain lead frames 6. Accordingly, the system is designed so that a given loader side magazine 1 is removed only after the judgement circuit 41 has judged that an operating cycle, in which the loader side magazine 1 is lowered by one stage (one pitch) and the frame pusher 7 goes through the pushing motion, has been repeated several times in succession.

Thus, when all of the lead frames 6 have been discharged by the frame pusher 7 and an operation in which the frame pusher 7 goes through the pushing motions has been repeated more than once for the empty lead frame sections, then it is judged that all the frame storing sections of the loader side magazine (1B) are empty, and this empty loader side magazine (1B) is discharged, so that the lead frames 6 in the next loader side magazine (1C) are supplied to the frame feeder 10. Thus, a wasted operation of the apparatus at the time of change-over between lots is eliminated, and waiting time between lots is also eliminated, thus improving productivity.

In the above embodiment, the frame pusher 7 feeds out lead frames 6 from the loader side magazines 1; however, it goes without saying that the present invention can be applied to an apparatus in which the lead frame feed-out is accomplished by a pull-in claw 8. It is obvious that in this case the judgement circuit 41 shown in FIG. 3 makes a judgement whether or not the absence of a lead frame 6 is detected by the frame confirmation sensor 14 when the pull-in claw 8 has operated.

As seen from the above, according to the present invention, loader side magazines which are not completely filled with lead frames can be identified, and such loader side magazines are discharged after the lead frames therein are fed out, so that the lead frames in the next loader side magazine can be fed out to the frame feeder. Accordingly, waiting time of the apparatus between lots is eliminated, and the productivity is improved.

What is claimed is:

1. A lead frame supplying apparatus in which a loader side magazine is positioned and carried on a loader side elevator device which is driven in a vertical direction, and lead frames which are stored in said loader side magazine are supplied to a frame feeder by means of a frame feed-out means, said apparatus being provided with a control circuit which includes:

a judgement circuit for judging when an absence of a lead frame has been detected by a lead frame confirmation sensor installed on said loader side magazine side of the frame feeder in spite of the fact that said frame feed-out means has operated, and a calculating unit for calculating an amount of movement required so as to position a lowermost frame storing section of a next loader side magazine at a frame conveying path level of said frame feeder in accordance with a signal from said judgement circuit.

2. An apparatus according to claim 1, wherein said signal outputted to said calculating unit from said judgement circuit is outputted when said absence of a lead frame has been detected one time or a multiple number of times.

* * * * *